United States Patent
Cheng et al.

(10) Patent No.: US 9,543,368 B2
(45) Date of Patent: Jan. 10, 2017

(54) OLED ARRAY SUBSTRATE HAVING BLACK MATRIX, MANUFACTURING METHOD AND DISPLAY DEVICE THEREOF

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/420,488

(22) PCT Filed: Jun. 30, 2014

(86) PCT No.: PCT/CN2014/081218
§ 371 (c)(1),
(2) Date: Feb. 9, 2015

(87) PCT Pub. No.: WO2015/032240
PCT Pub. Date: Mar. 12, 2015

(65) Prior Publication Data
US 2015/0249120 A1  Sep. 3, 2015

(30) Foreign Application Priority Data

Sep. 9, 2013 (CN) .......................... 2013 1 0406560

(51) Int. Cl.
*H01L 29/04* (2006.01)
*H01L 29/10* (2006.01)
(Continued)

(52) U.S. Cl.
CPC ......... *H01L 27/3272* (2013.01); *H01L 27/322* (2013.01); *H01L 51/5253* (2013.01);
(Continued)

(58) Field of Classification Search
CPC .. H01L 51/0545; H01L 27/1214; H01L 27/12; H01L 33/0079; B82Y 10/00
(Continued)

(56) References Cited

U.S. PATENT DOCUMENTS 6,429,916 B1 * 8/2002 Nakata ............. G02F 1/136227
349/106
2003/0067266 A1  4/2003 Kim et al.
(Continued)

FOREIGN PATENT DOCUMENTS

CN  1413069 A  4/2003
CN  1731905 A  2/2006
(Continued)

OTHER PUBLICATIONS

International Search Report dated Sep. 18, 2014; PCT/CN2014/081218.
(Continued)

*Primary Examiner* — Thao X Le
*Assistant Examiner* — Eric Jones
(74) *Attorney, Agent, or Firm* — Ladas & Parry LLP

(57) ABSTRACT

An OLED array substrate and a manufacturing method thereof, and a display device provided with the OLED array substrate are disclosed. The OLED array substrate includes a plurality of thin film transistors (2) disposed on a base substrate (1), each thin film transistor (2) being provided with a black matrix (6) thereon, and the black matrix (6) being provided with a via (60); over the black matrix (6) being disposed from bottom to top a first electrode (41), a luminescent layer (43) and a second electrode (42). The first electrode (41) is connected with the thin film transistor (2) through the via (60), and the first electrode (41) disposed over adjacent thin film transistors (2) are separated from each other by a barrier (44). The black matrix can block light (Continued)

emitted by the OLED to prevent TFTs from being illuminated, thereby ensuring the display effect of an active matrix type OLED display device.

17 Claims, 2 Drawing Sheets

(51) Int. Cl.
    *H01L 31/00*     (2006.01)
    *H01L 27/32*     (2006.01)
    *H01L 51/56*     (2006.01)
    *H01L 51/52*     (2006.01)

(52) U.S. Cl.
    CPC .......... *H01L 51/56* (2013.01); *H01L 27/3248* (2013.01); *H01L 51/5284* (2013.01); *H01L 2227/323* (2013.01)

(58) Field of Classification Search
    USPC ............................ 257/40, 59; 438/23, 28, 29
    See application file for complete search history.

(56) References Cited

U.S. PATENT DOCUMENTS

| | | | | |
|---|---|---|---|---|
| 2003/0136971 | A1* | 7/2003 | Rhee | ................. G02F 1/136227 |
| | | | | 257/98 |
| 2004/0041518 | A1* | 3/2004 | Yoneda | ............... H01L 27/3272 |
| | | | | 313/506 |
| 2004/0263441 | A1* | 12/2004 | Tanaka | ................... G09G 3/325 |
| | | | | 345/76 |
| 2005/0242713 | A1* | 11/2005 | Yamazaki | ........... H01L 51/5284 |
| | | | | 313/503 |
| 2007/0222379 | A1* | 9/2007 | Yamazaki | ........... H01L 27/3209 |
| | | | | 313/509 |
| 2010/0097296 | A1 | 4/2010 | Wang et al. | |
| 2012/0097930 | A1 | 4/2012 | Park et al. | |
| 2014/0054581 | A1* | 2/2014 | Song | ..................... G02F 1/1343 |
| | | | | 257/43 |

FOREIGN PATENT DOCUMENTS

| | | |
|---|---|---|
| CN | 100385707 C | 4/2008 |
| CN | 101728379 A | 6/2010 |
| CN | 103226272 A | 7/2013 |
| CN | 103456764 A | 12/2013 |
| CN | 203445125 U | 2/2014 |

OTHER PUBLICATIONS

Written Opinion of the International Searching Authority dated Sep. 22, 2014; PCT/CN2014/081218.

First Chinese Office Action dated May 6, 2015; Appln. No. 201310406560.2.

Second Chinese office Action Appln. No. 201310406560.2; Dated Oct. 10, 2015.

* cited by examiner

OLED ARRAY SUBSTRATE HAVING BLACK MATRIX, MANUFACTURING METHOD AND DISPLAY DEVICE THEREOF

TECHNICAL FIELD

The disclosure relates to an OLED array substrate and a manufacturing method thereof, and a display device comprises the OLED array substrate.

BACKGROUND

Organic electroluminescence displays, also known as organic light-emitting diode (OLED) display devices, with advantages such as low energy consumption, high luminance, fast response time, wide viewing angle and light weight, have been broadly applied in devices such as mobile communication terminals, personal digital assistants (PDAs) and palmtop computers. OLED display devices are classified into passive matrix type and active matrix type, wherein active matrix type OLED display devices utilize thin film transistors (TFTs) to drive OLEDs.

However, when an active matrix OLED display device displays images, the light emitted by the OLED tends to be incident on TFTs, which would influence the photocurrent of the TFTs, thereby causing current deviation in the OLED driven by the TFTs, and impacting the display effect.

SUMMARY

Embodiments of the present invention provide an OLED array substrate and a manufacturing method thereof, and a display device comprises the OLED array substrate.

According to a first aspect of the present invention, there is provided an OLED array substrate comprising: a plurality of thin film transistors disposed on a base substrate, a black matrix disposed over each of thin film transistors, the black matrix being provided with a via therein; a first electrode, a luminescent layer, and a second electrode disposed over the black matrix from bottom to top. The first electrode is connected with the thin film transistor through the via, and the first electrodes disposed over adjacent thin film transistors are separated from each other by a barrier.

In one example, a first protection layer is disposed between the first electrode and the thin film transistor, the black matrix and the first protection layer are disposed in same layer.

In one example, the luminescent layer is color luminescent layer.

In one example, the luminescent layer is white luminescent layer, a color filter layer is disposed between the first protection layer and the thin film transistor; and the via penetrates both the black matrix and the color filter layer.

In one example, the luminescent layer is white luminescent layer, a color filter layer and a first protection layer are disposed from bottom to top between the first electrode and the thin film transistor, the black matrix and the color filter layer are disposed in same layer; and the via penetrates both the first protection layer and the black matrix.

In one example, a second protection layer is further disposed between the color filter layer and the thin film transistor; and the via further penetrates the second protection layer.

In one example, the first electrode is anode, and the second electrode is cathode; or the first electrode is cathode, and the second electrode is anode.

In one example, the luminescent layers disposed over adjacent thin film transistors are separated from each other by the barrier.

In one example, the barrier is disposed in a projection area of the black matrix onto the base substrate.

According to a second aspect of the present invention, there is provided a method of manufacturing an OLED array substrate, comprising: forming a pattern comprising a plurality of thin film transistors on a base substrate; forming a pattern comprising a black matrix, the black matrix being located over each thin film transistor and provided with a via; and forming a pattern on the black matrix, the pattern comprising a first electrode, a barrier, a luminescent layer, and a second electrode, wherein the first electrode is connected with the thin film transistor through the via, and the first electrodes disposed over adjacent thin film transistors are separated from each other by the barrier.

In one example, the step of forming the pattern comprising the black matrix comprises: forming a pattern comprising both a first protection layer and a black matrix, wherein the first protection layer and a black matrix are disposed in same layer.

In one example, the luminescent layer is a color luminescent layer.

In one example, the luminescent layer is white luminescent layer, before the step of forming the pattern comprising both the first protection layer and the black matrix, the method further comprises: forming a pattern comprising a color filter layer; wherein the via penetrates both the black matrix and the color filter layer.

In one example, the step of forming the pattern comprising the black matrix comprises: forming a pattern comprising both a color filter layer and a black matrix, wherein the color filter layer and the black matrix are disposed in same layer. After the step of forming the pattern comprising both the color filter layer and the black matrix, the method further comprises: forming a pattern comprising a first protection layer; wherein the via penetrates both the first protection layer and the black matrix.

In one example, after the step of forming the pattern comprising the plurality of thin film transistors on the base substrate, the method further comprises: forming a pattern comprising a second protection layer; wherein the via further penetrates the second protection layer.

In one example, wherein the first electrode is anode, and the second electrode is cathode; or the first electrode is cathode, and the second electrode is anode.

In one example, the luminescent layers formed over adjacent thin film transistors are separated from each other by the barrier.

In one example, the barrier is disposed in a projection area of the black matrix onto the base substrate.

According to a third aspect of the present invention, there is provided a display device comprising the above-mentioned OLED array substrate.

BRIEF DESCRIPTION OF THE DRAWINGS

In order to explain the technical solution of embodiments of the present invention more clearly, accompanying drawings of the embodiments will be introduced briefly below. Obviously, the accompanying drawings in the following description only relate to some embodiments of the present invention rather than limiting the present invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

An OLED array substrate according to an embodiment of the present invention comprises thin film transistors (TFTs) disposed on a base substrate, a black matrix disposed over the TFTs, and vias formed in the black matrix. For each of TFTs, a first electrode, a luminescent layer and a second electrode are disposed over the black matrix from bottom to top. The first electrode is connected with the TFT through the via.

A method of manufacturing an OLED array substrate according to an embodiment of the present invention comprises:

S1: a pattern comprising a plurality of TFTs is formed on a base substrate.

S2: after the completion of the previous step, a pattern comprising a black matrix is formed on the substrate. The black matrix is formed over each of the TFTs and provided with vias therein.

S3: after the completion of the previous step, a pattern comprising a first electrode, a barrier, a luminescent layer, a second electrode are formed on the black matrix, where the first electrode is connected with the TFT through the via and two adjacent first electrodes are separated from each other by the barrier.

In the OLED array substrate provided in the embodiment of the present invention, a black matrix is disposed over the TFT, and a first electrode of the OLED is connected with the TFT through a via in the black matrix. When the OLED is driven by the TFT to display, the black matrix can prevent the light emitted by the OLED from incident on the TFT. Therefore, the current deviation would not occur in the OLED driven by the TFT, and the display effect of the active matrix type OLED display device can be ensured.

Embodiment 1

Figure 1:
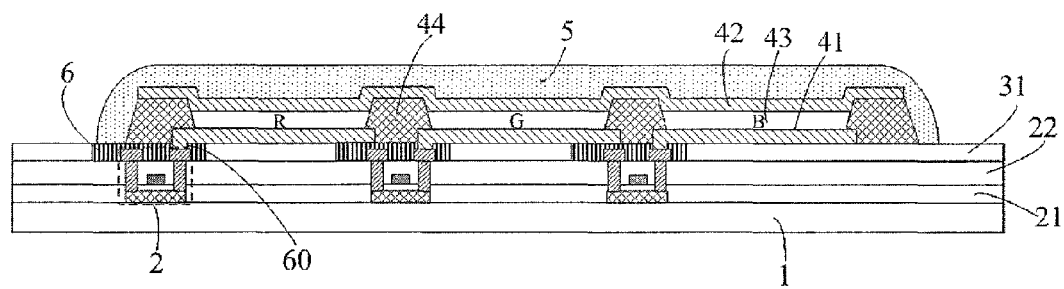
FIG. 1 is a schematically structural diagram of an OLED array substrate provided in embodiment 1 of the present invention.

As illustrated in FIG. 1, the OLED array substrate provided in an embodiment of the present invention comprises a plurality of TFTs 2, a gate insulating layer 21 and an interlayer insulating layer 22, all of which are disposed on a base substrate 1. A black matrix 6 and a first protection layer 31 are both disposed over each of TFTs 2. Over the first protection layer 31 are disposed from bottom to top a first electrode 41, a luminescent layer 43, and a second electrode 42, where the luminescent layer 43 is a color luminescent layer of red (R), green (G) or blue (B). The black matrix 6 disposed over the TFT 2 is in the same layer as the first protection layer 31. The black matrix 6 is provided with the vias 60. The first electrode 41 is connected with the TFT 2 through the via 60, and two adjacent first electrodes 41 are separated from each other by the barrier 44 therebetween. In addition, a packaging layer 5 is typically disposed over the second electrodes 42.

In the present embodiment, the first electrodes 41 are anodes of the OLED and the second electrodes 42 are cathodes of the OLED. In other embodiments, the first electrodes are used as cathodes of the OLED and the second electrodes are used as anodes of the OLED.

In the present embodiment, the luminescent layer 43 disposed over neighbor TFTs is disconnected by the barriers 44. In other embodiments, the luminescent layers 43 disposed over various TFTs may be formed integrally, that is, forming one luminescent layer overlaying both the barriers 44 and the first electrodes 41.

In the present embodiment, the barrier 44 is disposed in the projection area of the black matrix 6 projected onto the base substrate 1. The first electrode 41 extends cross the gap between two adjacent TFTs 2.

In the OLED array substrate provided in the embodiment of the present invention, the black matrix 6 is disposed over the TFT 2, and the first electrode 41 of the OLED is connected with the TFT 2 through the via 60 in the black matrix 6. When the OLED is driven by the TFT 2 to display images, the black matrix 6 can prevent the light emitted by the OLED from incident on the TFT 2. Therefore, the current deviation would not occur in the OLED driven by the TFT 2, and the display effect of the active matrix type OLED display device can be ensured.

The method of manufacturing an OLED array substrate provided in an embodiment of the present invention comprises:

S11: a pattern comprising a plurality of TFTs is formed on a base substrate.

For example, the TFTs, a gate insulating layer and an interlayer insulating layer are formed on the base substrate respectively by patterning process. TFT may be top-gate TFT or bottom-gate TFT.

S12: after the completion of the previous step, a pattern comprising a black matrix is formed on the substrate. The black matrix is formed over each of the TFTs and provided with vias therein.

In one example, the step S12 comprises:

S121: depositing a first protection layer on the substrate, and etching a part of the first protection layer that corresponds to the TFT by patterning process. The material of the first protection layer is for example silicon nitride (SiNx) or silicon oxide (SiOx).

S122: forming a black matrix with the vias in the etched part of the first protection layer, i.e., over the TFT, so as to block the TFT and prevent the TFT from being illuminated. Simultaneously, as the black matrix and the first protection layer are formed in the same layer, the entire surface of the substrate keeps flat.

The method further comprises:

S13: after the completion of the previous step S11, S12, a pattern comprising a first electrode, a barrier, a luminescent layer, a second electrode and a packaging layer are formed over the black matrix, where the first electrode is connected with the TFT through the via and two adjacent first electrodes are separated from each other by the barrier.

For example, the first electrodes, the barrier, the luminescent layer and the second electrode are formed respectively by patterning processes, and then the package layer is formed over the entire substrate to isolate various components on the substrate from the moisture and air in environment. The package layer may be an organic layer, an inorganic layer or a lamination of organic layer and inorganic layer.

Furthermore, the OLED may be packaged by other ways. For example, the package layer is first formed from resin material, and then a glass housing overlays the entire substrate. Alternatively, a sealing glue is applied in the periphery of the substrate first, and then the resin material or other sealants are filled in the middle region of the substrate, finally, a glass housing overlays the entire substrate. Alternatively, a molten glass material is applied in the periphery of the substrate after the package layer is formed, and then, a glass housing overlays the entire substrate, finally, the molten glass material is irradiated with laser so as to fusing the glass housing and the base substrate together.

In the embodiment of the present invention, both the base substrate and the package layer are of transparent material, therefore, the OLED array substrate provided in the embodiment of the present invention may be a double-side emission device. Of course, it is also possible to manufacture the OLED array substrate as a top emission device or a bottom emission device depending on practical situations.

Embodiment 2

Figure 2:
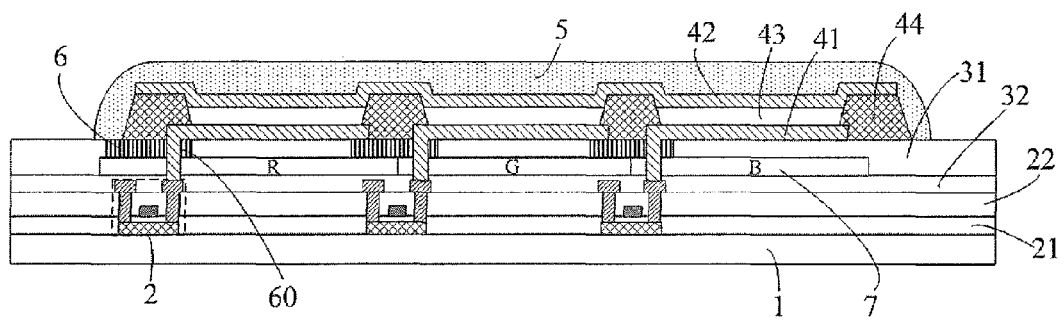
FIG. 2 is a schematically structural diagram of an OLED array substrate provided in embodiment 2 of the present invention.
Figure 3:
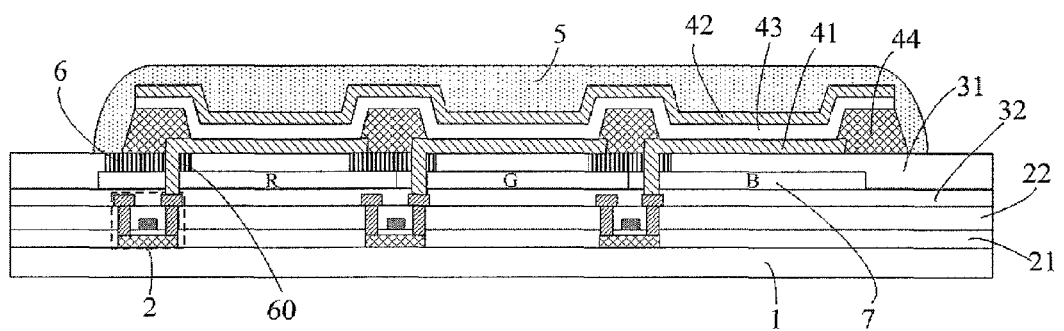
FIG. 3 is another schematically structural diagram of an OLED array substrate provided in embodiment 2 of the present invention.

As illustrated in FIGS. 2 and 3, the OLED array substrate provided in an embodiment of the present invention comprises a plurality of TFTs 2, a gate insulating layer 21 and an interlayer insulating layer 22, all of which are disposed on a base substrate 1. A color filter layer 7 of red (R), green (G) or blue (B) is disposed over each of TFTs 2, a first protection layer 31 is disposed over the color filter layer 7. Over the first protection layer 31 are disposed from bottom to top a first electrode 41, a luminescent layer 43, and a second electrode 42, wherein the luminescent layer 43 is a white luminescent layer. The black matrix 6 disposed over the TFT 2 is in the same layer as the first protection layer 31, and has vias 60 penetrating both the black matrix 6 and the color filter layer 7 formed therein. The first electrode 41 is connected with the TFT 2 through the via 60, and two adjacent first electrodes 41 are separated from each other by the barrier 44 therebetween. In addition, a package layer 5 is typically disposed over the second electrodes 42.

In the present embodiment, the first electrodes 41 are anodes of the OLED and the second electrodes 42 are cathodes of the OLED. In other embodiments, the first electrodes are used as cathodes of the OLED and the second electrodes are used as anodes of the OLED.

In the OLED array substrate provided in the embodiment of the present invention, the black matrix 6 is disposed over the TFT 2, and the first electrode 41 of the OLED is connected with the TFT 2 through the via 60 penetrating both the black matrix 6 and the color filter layer 7. When the OLED is driven by the TFT 2 to display images, the black matrix 6 can prevent the light emitted by the OLED from incident on the TFT 2. Therefore, the current deviation would not occur in the OLED driven by the TFT 2, and the display effect of the active matrix type OLED display device can be ensured.

Furthermore, in the embodiment of the present invention, the black matrix 6 disposed over the TFT 2 is also located between two adjacent sub-pixels (for example, red sub-pixel corresponds to the red color filter layer (R) in FIG. 2, green sub-pixel corresponds to the green color filter layer (G) in FIG. 2, blue sub-pixel corresponds to the blue color filter layer (B) in FIG. 2), therefore, the black matrix 6 can further prevent light emitted by OLED in the sub-pixel from incident on the color filter layer of adjacent other sub-pixels, which ensures color filter layers in each sub-pixel to align with the display area in OLED and thereby improving the definition of images displayed by the OLED display device.

As illustrated in FIGS. 2 and 3, for example, a second protection layer 32 is further disposed between the color filter layer 7 and the TFT 2, and the via 60 further penetrates the second protection layer 32 ("penetrate" used herein means partially penetrate, namely penetrating a part of the second protection layer 32). The material of the second protection layer 32 is for example silicon nitride or silicon oxide, which is used for protecting the TFT 2. Nevertheless, the color filter layer 7 in the embodiment of the present invention also functions to protect the TFT. Therefore, the second protection layer 32 may be omitted in some cases.

The method of manufacturing the OLED array substrate provided in an embodiment of the present invention comprises:

S21: a pattern comprising a plurality of TFTs is formed on a base substrate.

This step is the same as step S11 in embodiment 1. For example, the TFTs, a gate insulating layer and an interlayer insulating layer are formed on the base substrate respectively by patterning process.

S22: after the completion of the previous step, a pattern of the second protection layer is formed from silicon nitride or silicon oxide.

Since the second protection layer may be omitted in some cases, this step may also be omitted in certain cases.

S23: after the completion of the previous step, a pattern comprising color filter layers is formed.

For example, color filter layers of red, green and blue colors are formed on the substrate using colorful resin materials by patterning process.

S24: after the completion of the previous step, a pattern comprising a first protection layer and a black matrix which are disposed in the same layer are formed on the substrate. The black matrix is disposed over each TFT and provided with vias penetrating the black matrix, the color filter layer and the second protection layer.

In one example, the step S24 comprises:

S241: depositing a first protection layer on the substrate, and then etching a part of the first protection layer that corresponds to the TFT by patterning process. The material of the first protection layer is for example silicon nitride (SiNx) or silicon oxide (SiOx).

S242: forming a black matrix in the etched part of the first protection layer, i.e., over the TFT, so as to block the TFT and prevent the TFT from being illuminated. Simultaneously, as the black matrix and the first protection layer are formed in the same layer, the entire surface of the substrate keeps flat. Then, forming vias in the black matrix by patterning process, the vias penetrates the black matrix, the color filter layer and the second protection layer.

The method further comprises:

S25: after the completion of the previous step, a pattern comprising a first electrode, a barrier, a luminescent layer, a second electrode and a packaging layer are formed over the black matrix, where the first electrode is connected with the TFT through the via and two adjacent first electrodes are separated from each other by the barrier.

This step is substantially same as step S13 in embodiment 1 with the difference in that the luminescent layer 43 formed in the embodiment of the present invention may be formed respectively in each sub-pixel (as illustrated in FIG. 2) or formed as an entire layer on the substrate (as illustrated in FIG. 3).

In the OLED array substrate provided in the embodiment of the present invention, the OLED emits white light first, and then the white light is changed into full color display by the color filter layers. Therefore, the OLED array substrate provided in the embodiment of the present invention is a bottom emitting device.

Embodiment 3

Figure 4:
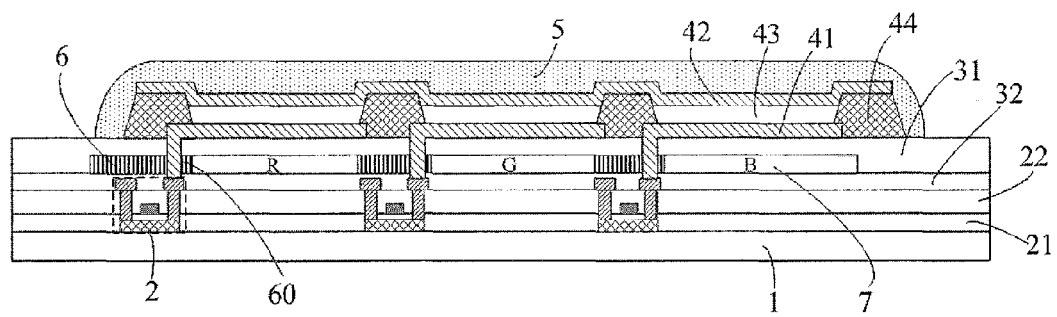
FIG. 4 is a schematically structural diagram of an OLED array substrate provided in embodiment 3 of the present invention.
Figure 5:
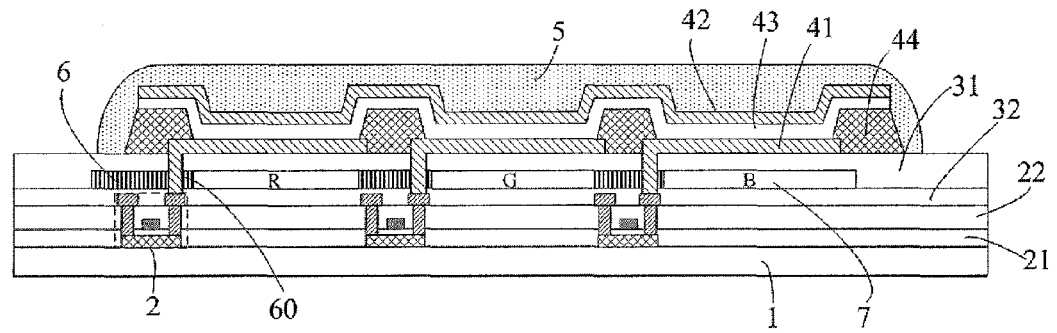
FIG. 5 is another schematically structural diagram of an OLED array substrate provided in embodiment 3 of the present invention.

The embodiment of the present invention is substantially same as embodiment 2 with the difference in that, as illustrated in FIGS. 4 and 5, the black matrix 6 and the color filter layer 7 in the present embodiment are disposed in the same layer, and the via 60 penetrates the first protection layer 31, the black matrix 6 and the second protection layer 32.

In the OLED array substrate provided in the embodiment of the present invention, a black matrix 6 is disposed over the TFT 2, and a first electrode 41 of the OLED is connected with the TFT 2 through a via 60 which penetrates three layers, i.e., the first protection layer 31, the black matrix 6 and the second protection layer 32. When the OLED is driven by the TFT to display images, the black matrix 6 can prevent the light emitted by the OLED from incident on the TFT 2. Therefore, the current deviation would not occur in the OLED driven by the TFT 2, and the display effect of the active matrix type OLED display device can be ensured.

Furthermore, in the embodiment of the present invention, the black matrix 6 disposed over the TFT 2 is also located between two adjacent sub-pixels, therefore, the black matrix 6 can further prevent light emitted by OLED in the sub-pixel from incident on the color filter layer of adjacent other sub-pixels, which ensures color filter layers in each sub-pixel to align with the display area in OLED and thereby improving the definition of images displayed by the OLED display device.

The method of manufacturing the OLED array substrate provided in an embodiment of the present invention comprises:

S31: a pattern comprising a plurality of TFTs is formed on a base substrate.

S32: after the completion of the previous step, a pattern of the second protection layer is formed.

The steps S31 and S32 are same as the steps S21 and S22 in embodiment 2, and will not be described in detail here.

S33: after the completion of the previous step, a pattern comprising the color filter layer and the black matrix which are disposed in the same layer are formed, the black matrix is disposed over each TFT.

For example, color filter layers of red, green and blue colors are formed on the substrate using color resin materials by patterning process, and then the black matrix is formed over the TFT and also between the color filter layers.

S34: after the completion of the previous step, a pattern comprising a first protection layer is formed on the substrate.

For example, the first protection layer is formed on the substrate by using silicon nitride, silicon oxide or organic resin, and then the vias penetrating the first protection layer, the black matrix and the second protection layer are formed by pattering process.

S35: after the completion of the previous step, a pattern comprising a first electrode, a barrier, a luminescent layer, a second electrode and a packaging layer are formed over the black matrix, where the first electrode is connected with the TFT through the via and two adjacent first electrodes are separated from each other by the barrier.

This step is same as the step S25 in embodiment 2, wherein the luminescent layers 43 may be formed respectively in each sub-pixel (as illustrated in FIG. 4) or formed as an entire layer on the substrate (as illustrated in FIG. 5).

In the OLED array substrate provided in the embodiment of the present invention, the OLED emits white light first, and then the white light is changed into full color display by the color filter layers. Therefore the OLED array substrate provided in the embodiment of the present invention is a bottom emitting device.

Embodiment 4

An embodiment of the present invention provides a display device comprising any of the OLED array substrate in the above-mentioned embodiments 1 to 3. The display device may be for example any product or component with display function such as an OLED panel, a TV set, a display, a digital picture frame, a cell phone, a tablet computer.

Since the display device provided in the embodiment of the present invention has the same construction as that of the above-mentioned OLED array substrate provided in embodiments of the present invention, it can result in the same technological effect and solve the same technical problems.

What are described above is related to the illustrative embodiments of the disclosure only and not limitative to the scope of the disclosure; the scopes of the disclosure are defined by the accompanying claims.

The present application claims priority from Chinese Application Serial Number 201310406560.2 filed on Sep. 9, 2013, the disclosure of which is hereby incorporated by reference herein in its entirety.

The invention claimed is:

1. An OLED array substrate, comprising: a plurality of thin film transistors disposed on a base substrate, a black matrix disposed over each of thin film transistors, the black matrix being provided with a via;

a first electrode, a luminescent layer, and a second electrode disposed over the black matrix from bottom to top;

a first protection layer, disposed between the first electrode and the thin film transistor; and a color filter layer, disposed between the first protection layer and the thin film transistor, wherein the first electrode is connected with the thin film transistor through the via, the first electrodes disposed over adjacent thin film transistors are separated from each other by a barrier, the black matrix and the first protection layer are disposed in a same layer, the black matrix overlaps the color filter layer partially, and the via penetrates a portion where the black matrix overlaps the color filter layer partially.

2. The OLED array substrate of claim 1, wherein the luminescent layer is color luminescent layer.

3. The OLED array substrate of claim 1, wherein the luminescent layer is white luminescent layer.

4. The OLED array substrate of claim 3, wherein a second protection layer is further disposed between the color filter layer and the thin film transistor; and the via further penetrates the second protection layer.

5. The OLED array substrate of claim 1, wherein the first electrode is anode, and the second electrode is cathode; or the first electrode is cathode, and the second electrode is anode.

6. The OLED array substrate of claim 1, wherein the luminescent layers disposed over adjacent thin film transistors are separated from each other by the barrier.

7. The OLED array substrate claim 1, wherein the barrier is disposed in a projection area of the black matrix onto the base substrate.

8. A display device, comprising the OLED array substrate of 1.

9. The OLED array substrate of claim 1, wherein a second protection layer is further disposed between the color filter layer and the thin film transistor; and the via further penetrates the second protection layer.

10. The OLED array substrate of claim 1, wherein the color filter layer includes color filters with different colors, and adjacent color filters with different colors are contacted with each other.

11. A method of manufacturing an OLED array substrate, comprising:
   forming a pattern comprising a plurality of thin film transistors on a base substrate;
   forming a pattern comprising a color filter layer below a black matrix;
   forming a pattern comprising both a first protection layer and the black matrix, wherein the first protection layer and the black matrix are disposed in a same layer, the black matrix being located over each thin film transistor and provided with a via, the the black matrix overlaps the color filter layer partially, and the via penetrates a portion where the black matrix overlaps the color filter layer partially; and
   forming a pattern on the black matrix, the pattern comprising a first electrode, a barrier, a luminescent layer, and a second electrode, wherein the first electrode is connected with the thin film transistor through the via, and the first electrodes disposed over adjacent thin film transistors are separated from each other by the barrier.

12. The method of claim 11, wherein the luminescent layer is color luminescent layer.

13. The method of claim 11, wherein after the step of forming the pattern comprising the plurality of thin film transistors on the base substrate, the method further comprises:
   forming a pattern comprising a second protection layer;
   wherein the via further penetrates the second protection layer.

14. The method of claim 11, wherein the first electrode is anode, and the second electrode is cathode; or
   the first electrode is cathode, and the second electrode is anode.

15. The method of 11, wherein the luminescent layers formed over adjacent thin film transistors are separated from each other by the barrier.

16. The method of 11, wherein the barrier is disposed in a projection area of the black matrix onto the base substrate.

17. The method of claim 11, wherein the color filter layer includes color filters with different colors, and adjacent color filters with different colors are contacted with each other.

* * * * *